(12) United States Patent
Yoshioka et al.

(10) Patent No.: US 8,105,514 B2
(45) Date of Patent: Jan. 31, 2012

(54) MOLD FOR PRODUCING SILICA CRUCIBLE

(75) Inventors: Takuma Yoshioka, Akita (JP); Masaki Morikawa, Akita (JP)

(73) Assignee: Japan Super Quartz Corporation, Akita-shi (JP)

( * ) Notice: Subject to any disclaimer, the term of this patent is extended or adjusted under 35 U.S.C. 154(b) by 212 days.

(21) Appl. No.: 12/688,501

(22) Filed: Jan. 15, 2010

(65) Prior Publication Data

US 2010/0176530 A1    Jul. 15, 2010

(30) Foreign Application Priority Data

Jan. 15, 2009  (JP) ................. 2009-006197
Dec. 9, 2009   (JP) ................. 2009-279621

(51) Int. Cl.
*C30B 13/06* (2006.01)
*B29C 39/08* (2006.01)

(52) U.S. Cl. ........ 264/114; 264/123; 264/125; 429/117; 429/134; 429/160; 65/144; 65/302

(58) Field of Classification Search .......... 264/114, 264/123, 125; 249/98, 117, 134, 137, 160; 65/144, 302

See application file for complete search history.

(56) References Cited

U.S. PATENT DOCUMENTS 7,160,387 B2 *  1/2007  Kishi et al. ............ 117/13
7,716,948 B2 *  5/2010  Kemmochi et al. ....... 264/114

FOREIGN PATENT DOCUMENTS

JP    2002-3228 A    1/2002
JP    2006-96616 A   4/2006

* cited by examiner

*Primary Examiner* — Richard Crispino
*Assistant Examiner* — Thukhanh Nguyen
(74) *Attorney, Agent, or Firm* — Christensen O'Connor Johnson Kindness PLLC

(57) ABSTRACT

In a mold for use in the production of a silica crucible, a mold cover corresponding to a small-diameter thinned portion of an upper part of the silica crucible is detachably disposed on a mold substrate corresponding to a main body of the silica crucible, and the mold cover has a barrier function against arc heating, and an inner diameter of the mold cover is smaller than that of the mold substrate but larger than that of the silica crucible.

6 Claims, 3 Drawing Sheets

MOLD FOR PRODUCING SILICA CRUCIBLE

BACKGROUND OF THE INVENTION

1. Field of the Invention

This invention relates to a mold suitable for use in the production of a silica crucible used when producing a silicon single crystal ingot by a pulling method such as the CZ method or the like.

Particularly, the invention is directed to advantageously reduce the amount of silica or quartz powder used when producing a silica crucible by a rotating mold method.

2. Description of the Related Art

Recently, the use of a silicon wafer as a substrate for semiconductor devices has increased rapidly. Such a silicon wafer is usually produced by forming a silicon single crystal ingot and then slicing it.

Such a silicon single crystal ingot is generally produced, for example, by a pulling method such as the CZ method or the like. Also, a silica crucible is used for pulling the silicon single crystal.

A typical method of producing a silica crucible is known as the rotating mold method. The rotating mold method is a method wherein silica or quartz powder is attached to an inner wall of a rotating mold, that is, a bottom surface and a side surface of the mold and then fused by heating (e.g., by arc heating) to produce a silica crucible.

Recently, the silicon single crystal ingot is desired to have a larger diameter in association with the rapid increase in the demand for silicon wafers.

When such a large-diameter silicon single crystal ingot is produced by the pulling method, the silica crucible to be used is also required to have a larger diameter.

In order to produce the silicon single crystal ingot by the pulling method, it is usually required to use a silica crucible having a diameter corresponding to about three times the diameter of the ingot.

When the silica crucible is produced by the above-mentioned rotating mold method, a portion having a small outer diameter and a thin thickness (hereinafter referred to as a small-diameter thinned portion) occurs in an upper part of the silica crucible, and hence it is required to remove the small-diameter thinned portion by cutting.

When the silica crucible is heated to a high temperature in a step for filling and melting Si in the silica crucible to pull an Si single crystal, the viscosity of silica is reduced as the temperature rises and hence the silica crucible is easily deformed. Especially when the upper part of the silica crucible is the small-diameter thinned portion, it is apt to be fallen down inward and easily deformed.

A cause of forming such a small-diameter thinned portion is that heat easily escapes at the opening portion of the mold and the silica or quartz powder is not completely melted by arc heating, and hence the outer diameter at the upper part of the silica crucible becomes small and the thickness thereof becomes thin. The formation of such a small-diameter thinned portion is unavoidable in the production process.

As a technique for preventing the small-diameter thinned portion of the crucible from falling down inward, JP-A-2006-96616 proposes a silica glass crucible in which a ring-shaped member preferably made of carbon is embedded in the upper portion of the crucible. The development of such a silica glass crucible can reduce the falling of the small-diameter thinned portion of the crucible inward. However, the formation of the small-diameter thinned portion cannot be completely prevented. Therefore, it is still difficult to produce a good silicon single crystal ingot by the pulling method even when such a silica glass crucible is used.

Therefore, when the silica crucible is produced by the rotating mold method, by anticipating the formation of the small-diameter thinned portion is produced a silica crucible having a crucible height higher by the small-diameter thinned portion than a specification height of a product and then the small-diameter thinned portion is removed by cutting to obtain a product.

Also, silica crucibles having different heights may be produced in the same mold. Although there is no problem in the production of a silica crucible having a higher height, a portion to be removed by cutting becomes large in the production of a silica crucible having a low height. In order to solve the problem, a mold for exclusive use for a product having a low height may be provided, but when the number of silica crucibles produced is small or the like, there is a disadvantage that the production cost of a new mold and related costs become significant.

As described above, when the silica crucible is produced by the rotating mold method, the formation of the small-diameter thinned portion is unavoidable, so that a silica crucible having a crucible height higher by the small-diameter thinned portion than a height of a product specification is produced and then the small-diameter thinned portion is removed by cutting to obtain a product (silica crucible) through usual steps.

However, the silica crucible is recently required to have a large diameter with the increase of the diameter of the silicon single crystal ingot as described above.

When the diameter of the crucible is made larger, a portion obliged to be removed by cutting is also increased due to the small-diameter thinning, which causes a serious problem in terms of the material cost, and hence the production cost.

For example, if it is intended to produce a crucible having an outer diameter of about 457 mm (18 inches) and a thickness of 8 mm, about 0.3 kg of silica or quartz powder as an absolute amount is used extra per cutting-removing height of 10 mm.

On the other hand, if it is intended to produce a large-size silica crucible having an outer diameter of about 813 mm (32 inches), the thickness increases to approximately 15 mm, and hence about 1.0 kg of silica or quartz powder as an absolute amount is used extra per cutting-removing height of 10 mm.

In the production of a large-size silica crucible, therefore, the wasted amount of silica or quartz powder used per cutting-removing height in the production of one crucible increases to three to four times that of producing a small-size silica crucible.

SUMMARY OF THE INVENTION

The invention is developed in the light of the above situation and is to provide a mold for producing a silica crucible capable of reducing a portion obliged to be removed by cutting due to the small-diameter thinning in the upper part of the silica crucible to effectively reduce the material cost.

That is, the summary and construction of the invention are as follows:

1. A mold for use in the production of a silica crucible, comprising: a mold substrate having a shape corresponding to a main body of a silica crucible to be formed in the mold; a mold cover having a shape corresponding to a shape of a small-diameter thinned portion of an upper part of the silica crucible to be formed in the mold, wherein the mold cover is detachably disposed on the mold substrate, and the mold cover has a barrier function against arc heating, and an inner diameter of the mold cover is smaller than an inner diameter of the mold substrate but larger than an inner diameter of the silica crucible to be formed in the mold.

2. A mold for use in the production of a silica crucible according to item 1, wherein a protruding thickness $t_1$ of an inner surface of the mold cover from an inner surface of the mold substrate, which is defined by $t_1$=(inner diameter of mold substrate−inner diameter of mold cover)/2, is 20 to 80% of a thickness $t_2$ of silica or quartz powder attached to the inner surface of the mold substrate.

3. A mold for use in the production of a silica crucible according to item 1, wherein an outer diameter of the mold cover is smaller than an outer diameter of the mold substrate.

4. A mold for use in the production of a silica crucible according to item 1, wherein the mold cover is of onepiece-type or split-type.

5. A mold for use in the production of a silica crucible according to item 1, wherein the mold is used in a rotating mold method.

6. A method for making a crucible, comprising: providing a mold with a substrate in a shape corresponding to a main body of a crucible to be formed in the mold; providing a mold cover detachably disposed on the mold substrate; providing quartz or silica powder in the mold; rotating the mold; and fusing the silica or quartz powder attached onto an inner wall of the mold through arc heating to provide a formed crucible, wherein the mold cover has a shape corresponding to a shape of a small-diameter thinned portion of an upper part of the formed crucible, and the mold cover has a barrier function against arc heating, and an inner diameter of the mold cover is smaller than an inner diameter of the mold substrate but larger than an inner diameter of the silica crucible.

According to the invention, it is possible to reduce a portion to be removed by cutting due to the small-diameter thinning as compared with the conventional technique, and as a result, the material cost as well as the production cost can be reduced.

Also, according to the invention, the outer diameter of the mold cover is made smaller than the outer diameter of the mold substrate to form a mold cover being thin in the thickness and light in the weight, whereby the mold cover can be simply placed on the mold substrate.

Furthermore, it is advantageous that since the mold cover can be simply separated from the mold substrate, the silica crucible is easily taken out from the mold. In addition, the removal of the mold cover can be conducted more easily by using a split-type mold cover.

Moreover, the mold cover of the invention has an advantage that it can be used repeatedly.

BRIEF DESCRIPTION OF THE DRAWINGS

The invention will be described concretely with reference to the accompanying drawings, wherein.

DESCRIPTION OF THE PREFERRED EMBODIMENTS

Figure 1:
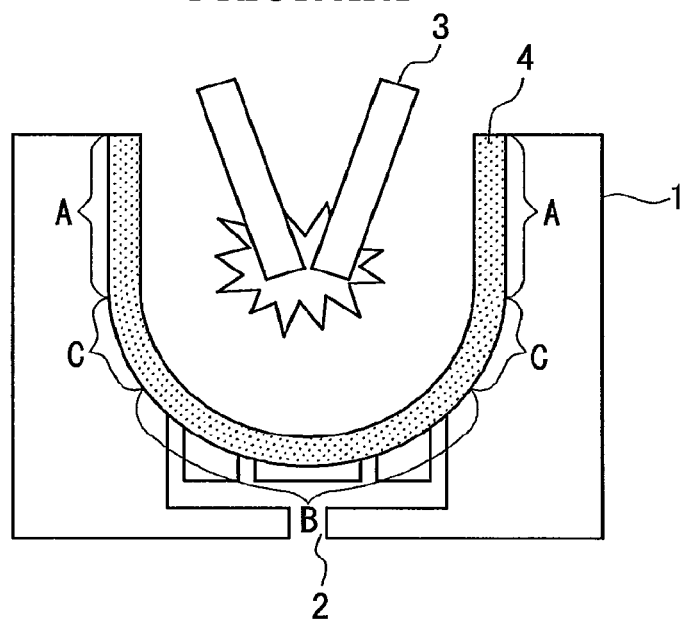
FIG. 1 is a schematically cross-sectional view illustrating a production manner of a silica crucible by a rotating mold method.

In FIG. 1 is schematically shown a typical production manner of a silica crucible by a rotating mold method. In FIG. 1, numeral 1 is a mold, numeral 2 a vent pipe, numeral 3 arc electrodes, and numeral 4 silica or quartz powder attached onto an inner wall of the mold 1. Moreover, the mold 1 comprises a cylindrical straight body A, a cone-shaped bottom portion B and a corner portion C connecting them as shown in FIG. 1.

In the rotating mold method, the silica or quartz powder 4 attached onto the inner wall of the rotating mold 1 can be vitrified by heat-fusing through arc heating and shaped into a crucible form.

Figure 2:
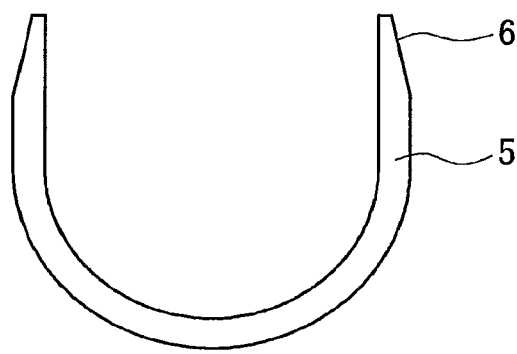
FIG. 2 is a schematically cross-sectional view of a silica crucible produced using a commonly-used mold.

In FIG. 2 is shown a cross-sectional shape of a vitreous silica crucible 5 produced by using a commonly-used conventional mold.

As shown in FIG. 2, the upper portion of the vitreous silica crucible 5 becomes smaller in the outer diameter and thinner in the thickness to form a small-diameter thinned portion 6.

Figure 3:
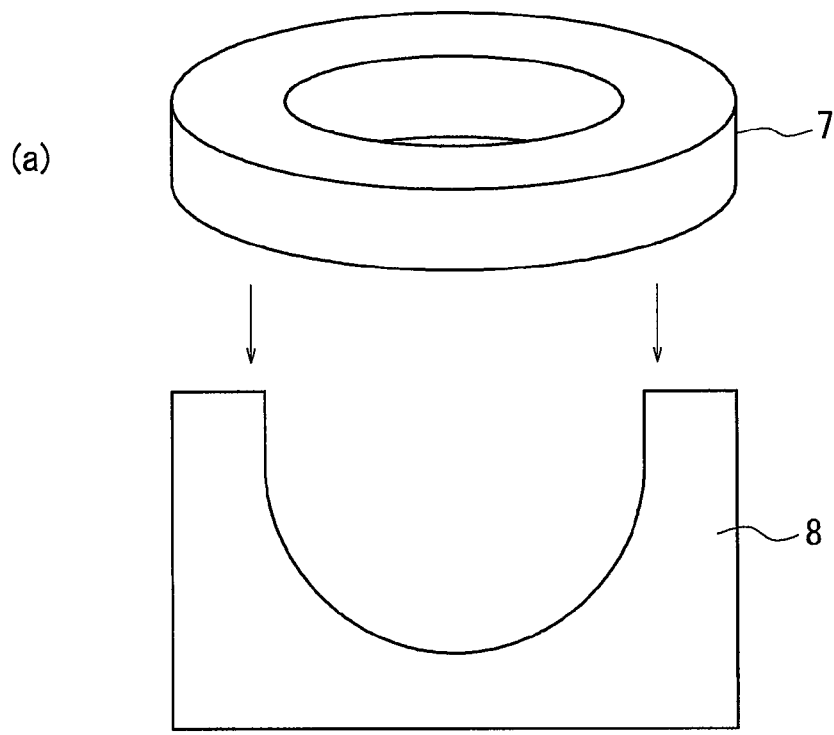
FIG. 3 is a schematic view of a mold according to the invention, wherein (a) is an exploded view of the mold and (b) is a diagram showing a state of combining a mold cover and a mold substrate.
Figure 3:
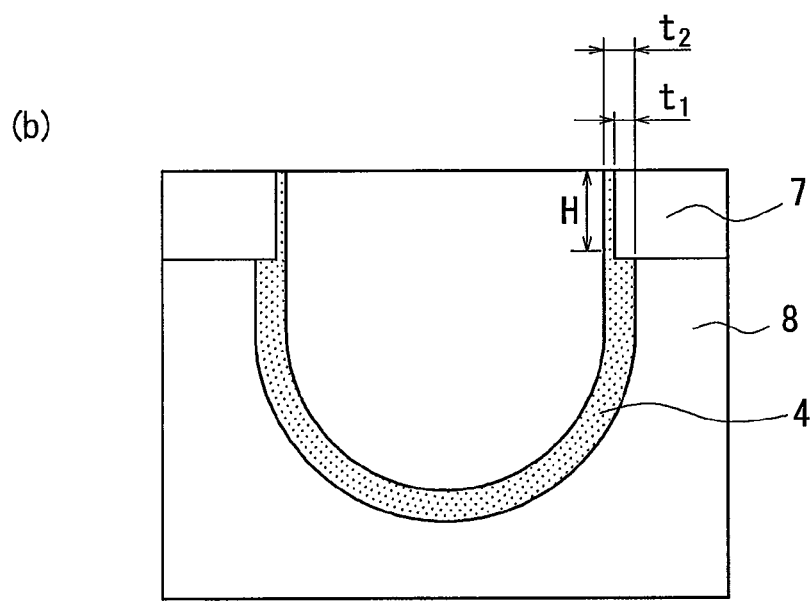

In the invention, as shown in FIG. 3, a mold has a structure in which a mold cover is disposed on a mold substrate, and the shape of the mold cover is devised so as to solve the above problem.

The invention is based on a technological idea that if an upper portion of a crucible becomes inevitably smaller in the outer diameter and thinner in the thickness in the production of the silica crucible, the mold for the crucible is preliminarily rendered into a shape corresponding to the shape of the upper portion of the crucible, whereby an amount of silica or quartz powder wastefully used can be reduced.

Also, the invention is based on a technological idea that if the mold is divided into a mold substrate and a mold cover so as to have a structure that the mold cover is replaceable, the degree of freedom in the inner diameter of the mold cover increases but also the silica crucible is taken out easily from the mold, and it is particularly easier to take out the silica crucible from the mold by using a split-type mold cover.

Moreover, JP-A-2002-3228 discloses a mold having a two-tiered structure. However, such a mold is merely divided into upper and lower mold parts for changing materials of the upper and lower mold parts, and no consideration is taken for reducing the amount of silica or quartz powder wastefully used by devising the shape of the upper mold part. Therefore, the technological idea of this patent document is completely different from that of the invention.

In FIG. 3, numeral 7 is a mold cover and numeral 8 is a mold substrate.

As shown in FIG. 3(a), the mold of the invention has such a structure that the mold cover 7 corresponding to the small-diameter thinned portion of the upper part of the silica crucible is disposed on the mold substrate 8 corresponding to the main body of the silica crucible. The mold cover 7 may be either of onepiece-type or of split-type. When the mold cover is of split-type, it is preferable to divide the mold cover into two parts to four parts.

In the invention, it is important that the inner diameter of the mold cover 7 is made smaller than the inner diameter of the mold substrate 8.

At this moment, a protruding thickness $t_1$ of an inner surface of the mold cover from an inner surface of the mold substrate is preferable to be 20 to 80% of a thickness $t_2$ of silica or quartz powder attached to the inner wall of the mold substrate.

When the ratio of the protruding thickness $t_1$ to the attached thickness $t_2$ is less than 20%, the effect of reducing the silica or quartz powder used and hence the cost-saving effect is small, while when it exceeds 80%, there is a risk that the mold cover will be oxidized and consumed at a higher temperature during arc heating.

Also, the height H of the mold cover 7 may be equal to the height of the small-diameter thinned portion. For example, when a crucible having an outer diameter of about 813 mm (32 inches) and a thickness of 15 mm is produced, the height of the small-diameter thinned portion is about 30 to 100 mm.

Figure 4:
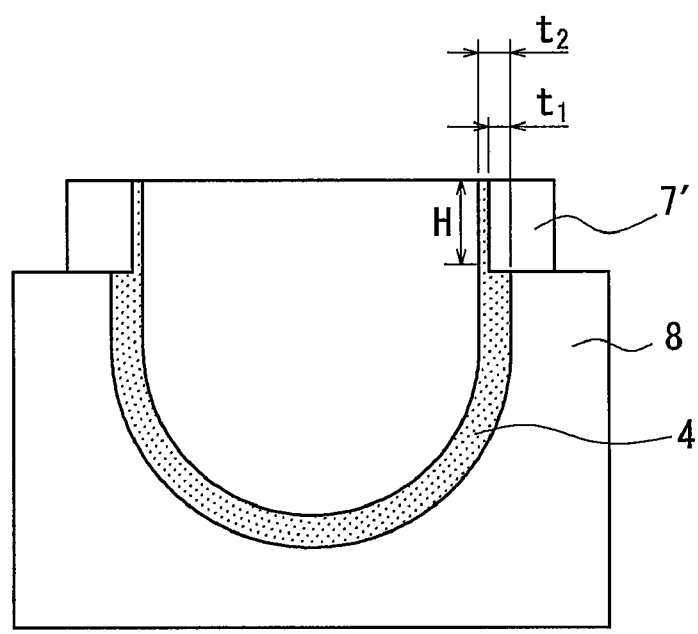
FIG. 4 is a diagram showing another example of a mold according to the invention.

Furthermore, as shown in FIG. 4, it is advantageous that an outer diameter of the mold cover 7' is made smaller than an outer diameter of the mold substrate 8. When the outer diameter of the mold cover 7' is made smaller to reduce the weight, the detachment of the mold cover 7' becomes more easier.

Moreover, the thickness of the mold cover 7, 7' is not particularly limited but is preferable to be about 20 to 150 mm.

In the invention, the inner surface of the mold cover is preferable to have a surface roughness of about 6.3 to 25 μm as an arithmetic mean roughness Ra.

When the roughness of the inner surface of the mold cover is less than 6.3 μm as Ra, silica or quartz powder easily moves at the time of attachment or heat-fusion of the silica or quartz powder and hence the deterioration of the crucible accuracy is caused, while when it exceeds 25 μm, grains are fallen off from the surface of the mold cover to form impurities in the silica crucible.

In the invention, it is required to impart a barrier function against arc heating to the mold cover, so that a material for the mold cover is required to be excellent in the heat insulating properties and heat resistance and small in the thermal expansion and variation with time. As a typical material for the mold cover is exemplified carbon (thermal conductivity: about 140 W/mK, thermal expansion coefficient: about $5 \times 10^{-6}/°C$.).

EXAMPLE 1

When a silica crucible is produced with a mold having the conventional structure as shown in FIG. 1, the weight of silica or quartz powder used in the upper part of the crucible to be cut is represented by the following equation:

Weight of silica or quartz powder used={(inner radius of mold)$^2$−(inner radius of mold−attached thickness)$^2$}×3.14×cutting height×bulk specific gravity of silica or quartz powder (B-value)

On the contrary, when a silica crucible is produced with a mold having a structure according to the invention as shown in FIG. 3, the amount of silica or quartz powder used can be reduced by an amount represented by the following equation:

Amount of silica or quartz powder reduced={(inner radius of mold cover+protruding thickness)$^2$−(inner radius of mold cover)$^2$}×3.14×height of mold cover×bulk specific gravity of silica or quartz powder (A-value).

Therefore, according to the invention, the amount of silica or quartz powder used can be reduced as compared with the conventional case by an amount represented by an equation of (A/B)×100(%).

When an 18 inch silica crucible having an outer diameter of 458 mm and a thickness of 8 mm is actually produced with the mold having a structure according to the invention as shown in FIG. 3, A-value=0.8 kg is obtained, and hence the amount of silica or quartz powder used can be reduced by about 42% as compared with the conventional case of B-value=1.9 kg, which corresponds to about 0.13 kg per cutting-removing height of 10 mm as an absolute amount (provided that a cutting height of an upper part of a crucible is 60 mm; an inner diameter of a mold cover is 448 mm; a height H of a mold cover is 50 mm; a protruding thickness $t_1$ of a mold cover is 9 mm; an attached thickness $t_2$ of silica or quartz powder is 18 mm; and a bulk specific gravity of silica or quartz powder is 1.23).

EXAMPLE 2

When a 32 inch silica crucible having an outer diameter of 810 mm and a thickness of 15 mm is produced with the mold as shown in FIG. 3 in the same manner as in Example 1, A-value=6.2 kg is obtained, and hence the amount of silica or quartz powder used can be reduced by about 43% as compared with the conventional case of B-value=14.5 kg, which corresponds to about 0.52 kg per cutting-removing height of 10 mm as an absolute amount (provided that a cutting height of an upper part of a crucible is 120 mm; an inner diameter of a mold cover is 780 mm; a height H of a mold cover is 100 mm; a protruding thickness $t_1$ of a mold cover is 20 mm; an attached thickness $t_2$ of silica or quartz powder is 40 mm; and a bulk specific gravity of silica or quartz powder is 1.23).

Thus, when the invention is applied to the production of large-size crucibles, the greater effect of reducing the amount of silica or quartz powder used can be obtained.

What is claimed is:

1. A mold for use in the production of a silica crucible, comprising:
   a mold substrate having a shape corresponding to a main body of a silica crucible to be formed in the mold;
   a mold cover having a shape corresponding to a shape of a small-diameter thinned portion of an upper part of the silica crucible to be formed in the mold, wherein the mold cover is detachably disposed on the mold substrate, and the mold cover has a barrier function against arc heating, and an inner diameter of the mold cover is smaller than an inner diameter of the mold substrate but larger than an inner diameter of the silica crucible to be formed in the mold.

2. A mold for use in the production of a silica crucible according to claim 1, wherein a protruding thickness $t_1$ of an inner surface of the mold cover from an inner surface of the mold substrate, which is defined by $t_1$=(inner diameter of mold substrate−inner diameter of mold cover)/2, is 20 to 80% of a thickness $t_2$ of silica or quartz powder attached to the inner surface of the mold substrate.

3. A mold for use in the production of a silica crucible according to claim 1, wherein an outer diameter of the mold cover is smaller than an outer diameter of the mold substrate.

4. A mold for use in the production of a silica crucible according to claim 1, wherein the mold cover is of onepiece-type or split-type.

5. A mold for use in the production of a silica crucible according to claim 1, wherein the mold is used in a rotating mold method.

6. A method for making a crucible, comprising:
   providing a mold with a substrate in a shape corresponding to a main body of a crucible to be formed in the mold;
   providing a mold cover detachably disposed on the mold substrate;

providing quartz or silica powder in the mold;
rotating the mold; and
fusing the silica or quartz powder attached onto an inner wall of the mold through arc heating to provide a formed crucible, wherein the mold cover has a shape corresponding to a shape of a small-diameter thinned portion of an upper part of the formed crucible, and the mold cover has a barrier function against arc heating, and an inner diameter of the mold cover is smaller than an inner diameter of the mold substrate but larger than an inner diameter of the crucible.

* * * * *